(12) United States Patent
Kawano

(10) Patent No.: US 8,208,226 B2
(45) Date of Patent: Jun. 26, 2012

(54) SUSPENSION SUBSTRATE, SUSPENSION, HEAD SUSPENSION AND HARD DISK DRIVE

(75) Inventor: Shigeki Kawano, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 485 days.

(21) Appl. No.: 12/606,345

(22) Filed: Oct. 27, 2009

(65) Prior Publication Data

US 2010/0142097 A1 Jun. 10, 2010

(30) Foreign Application Priority Data

Oct. 29, 2008 (JP) ................................. 2008-278037

(51) Int. Cl.
*G11B 5/48* (2006.01)
(52) U.S. Cl. .................................................... 360/245.9
(58) Field of Classification Search .............. 360/245.9, 360/245.7, 245.3, 245.8, 245, 245.4, 244.3, 360/234.5, 244.8, 244.1, 244
See application file for complete search history.

(56) References Cited

U.S. PATENT DOCUMENTS

| | | | | |
|---|---|---|---|---|
| 5,717,547 | A * | 2/1998 | Young .......................... | 360/246 |
| 5,737,152 | A * | 4/1998 | Balakrishnan .............. | 360/245.9 |
| 5,995,328 | A * | 11/1999 | Balakrishnan .............. | 360/245.9 |
| 6,038,102 | A * | 3/2000 | Balakrishnan et al. ..... | 360/264.2 |
| 6,275,358 | B1 * | 8/2001 | Balakrishnan et al. ..... | 360/264.2 |
| 6,639,323 | B2 * | 10/2003 | Akiyama et al. ............ | 257/778 |
| 7,420,284 | B2 * | 9/2008 | Miyazaki et al. ............ | 257/781 |
| 2004/0061220 | A1 * | 4/2004 | Miyazaki et al. ............ | 257/723 |

FOREIGN PATENT DOCUMENTS

| | | |
|---|---|---|
| JP | 08-102162 A | 4/1996 |
| JP | 09-022570 A | 1/1997 |
| JP | 10-003632 A | 1/1998 |

* cited by examiner

*Primary Examiner* — Allen Cao
(74) *Attorney, Agent, or Firm* — Ladas & Parry LLP

(57) ABSTRACT

It is a primary object of the present invention to provide a suspension substrate having reduced strain. The present invention solves the problem by providing a suspension substrate comprising: a fundamental structure in which a metal substrate, a first insulation layer, and a wiring are laminated in this order; a wide wiring laminate structure provided with a wide wiring first insulation part of the first insulation layer, a first wide wiring formed on the wide wiring first insulation part, a second insulation part formed on the first wide wiring, and a second wide wiring formed on the second insulation part; and a narrow wiring-containing structure provided with a narrow wiring first insulation part of the first insulation layer and a first narrow wiring formed on the narrow wiring first insulation part, wherein the narrow wiring-containing structure is provided with a strain-limiting part formed to limit strain generated in relation to the wide wiring laminate structure.

11 Claims, 7 Drawing Sheets

SUSPENSION SUBSTRATE, SUSPENSION, HEAD SUSPENSION AND HARD DISK DRIVE

BACKGROUND OF THE INVENTION

1. Field of the Invention

The present invention relates to a suspension substrate used for a magnetic head suspension for a HDD, and, particularly, to a suspension substrate having reduced strain.

2. Description of the Related Art

In recent years, there have been great demands for increases in the amount of information processing and in information processing speed of a personal computer with, for example, the distribution of Internet. Along with this, it has become necessary for hard disc drives (HDD) incorporated into a personal computer to increase its capacity and its information communication speed. The magnetic head suspension used in this HDD is provided usually with a suspension substrate mounted with a magnetic head. Also, the suspension substrate is formed with wirings (read wiring and write wiring) made of conductive thin films to connect this magnetic head with the read/write wirings of the magnetic disc device.

In current suspension substrates, plural (for example, two) wirings having a narrow width are generally formed on the same plane of the insulation part. On the other hand, a suspension substrate is known in which plural wirings having a wide width are not formed on the same plane but are laminated through an insulation part. In, for example, Japanese Patent Application Publication (JP-A) No. 10-3632, there is disclosed a magnetic head suspension having a gimbal suspension obtained by laminating two or more wirings having a wide width through an insulation part. Also, in JP-A No. 9-22570, there is also disclosed a head assembly obtained by laminating wirings having a wide width through an insulation part. Further, in JP-A No. 8-102162, a magnetic head suspension is disclosed in FIG. 1, in which a wiring pattern comprising an effective wiring 3 and a dummy wiring pattern 2 which are substantially symmetric with respect to the suspension center line 4 is arranged on a spring part 1c of a suspension body 1.

SUMMARY OF THE INVENTION

As mentioned above, a suspension substrate having a structure (wide wiring laminating structure) in which wirings having a wide width are laminated through an insulation part has been known. For example, in the case where the suspension substrate is used for the purpose of high-frequency transmission, it is effective to form a wide wiring laminate structure on the write wiring side where a low impedance is required. On the read wiring side, on the other hand, not so low impedance is required as compared with that on the write wiring side at present, and therefore, there is the case where the same structure that is conventionally used may be formed as long as it is a structure (narrow wiring monolayer structure) provided with plural (for example, two) narrow wirings on the same plane of the insulation part.

In this case, the obtained substrate is assumed to be, for example, a suspension substrate in which a wide wiring laminate structure is formed on the write wiring side and a narrow wiring monolayer structure is formed on the read wiring side. Specifically, as shown in FIG. 11A, a suspension substrate is assumed in which: a wide wiring laminate structure A is formed on the write wiring side 30x and the structure is provided with a wide wiring first insulation part 2a, a first wide wiring 4a formed on the wide wiring first insulation part 2a, a second insulation part 5a formed on the first wide wiring 4a, and a second wide wiring 7a formed on the second insulation part 5a; and a narrow wiring monolayer structure C is formed on the read wiring 30y side and the structure is provided with a narrow wiring first insulation part 2b and plural (two) first narrow wirings 4b formed on the first insulation 2b.

However, such a suspension substrate is, as shown in FIG. 11B, provided with the write wiring 30x having a wide wiring laminate structure and a read wiring 30y having a narrow wiring monolayer structure. Therefore, this structure poses such a problem that the rigidity balance and weight balance of the whole suspension substrate are inferior, resulting in the occurrence of strain.

Also, as mentioned above, the narrow wiring monolayer structure is currently used both on the write wiring side and on the read wiring side in a conventional suspension substrate. As the materials for the conductive layer, insulating layer and metal substrate in a suspension substrate like this, materials having linear expansion coefficients close to those of the conductive layer, insulating layer and metal substrate respectively have been used so far to prevent warpage resulting after production of the suspension substrate. However, even in the case of using a material having a close linear expansion coefficient, it is difficult to perfectly prevent warpage caused by thermal shrinkage resulting from the heat history through which the suspension substrate is produced. Moreover, when the wide wiring laminate structure and the narrow wiring monolayer structure are arranged at the right and left positions with respect to the center line of the suspension substrate, the suspension substrate is more outstandingly affected by thermal shrinkage, causing the warpage of the whole suspension more easily than when two narrow wiring monolayer structures are arranged at the right and left positions with respect to the center line of the suspension substrate. This is because the wide wiring laminate structure has such rigid structural characteristics that two wirings are laminated through an insulation layer and also, two wirings are wide, so that this structure is outstandingly affected by thermal shrinkage.

When the wide wiring laminate structure and the narrow wiring monolayer structure are arranged at the right and left positions with respect to the center line of the suspension substrate, there are problems concerning not only the warpage of the whole suspension substrate but also the occurrence of strain in the plane of the suspension substrate. This is caused by a difference in the degree of thermal shrinkage between the wide wiring laminate structure and the narrow wiring monolayer structure. Moreover, as mentioned above, there is a significant difference in weight between the wide wiring laminate structure and the narrow wiring monolayer structure. Also, this point is also a cause of easy occurrence of strain in the plane of the suspension substrate.

The present invention has been made in view of the above situation and it is a main object of the present invention to provide a suspension substrate having reduced strain.

The above problem is solved by a suspension substrate according to an embodiment of the present invention comprising: a fundamental structure in which a metal substrate, a first insulation layer, and a wiring are laminated in this order; a wide wiring laminate structure provided with a wide wiring first insulation part of the first insulation layer, a first wide wiring formed on the wide wiring first insulation part, a second insulation part formed on the first wide wiring, and a second wide wiring formed on the second insulation part; and a narrow wiring-containing structure provided with a narrow wiring first insulation part of the first insulation layer and a first narrow wiring formed on the narrow wiring first insulation part, wherein the narrow wiring-containing structure is provided with a strain-limiting part formed to limit strain generated in relation to the wide wiring laminate structure.

According to the present invention, the narrow wiring-containing structure is provided with a strain-limiting part, and therefore, the rigidity balance and weight balance of the whole suspension substrate are bettered, so that the suspension substrate is reduced in strain. This ensures, for example, that FH (Fly Height) which defines the clearance between the magnetic head and the disc can be stably maintained.

It is preferable that the wiring having the above wide wiring laminate structure be a write wiring and the wiring having the above narrow wiring-containing structure be a read wiring. This is because it is desired to develop a write wiring having lower impedance.

In the above invention, the above strain-limiting part is preferably a dummy wiring. This is because this structure enables the production of a suspension substrate which is easily manufactured and has reduced strain.

In the above invention, the above dummy wiring is preferably a dummy wide wiring and the above dummy wide wiring is preferably formed on the above first narrow wiring through a second insulation part. A suspension substrate reduced in strain can be manufactured easily by disposing the dummy wide wiring at a predetermined place.

In the above invention, it is preferable that the above dummy wiring is a dummy wide wiring and a dummy narrow wiring, the above dummy wide wiring is formed on the above first narrow wiring through a second insulation part and the above dummy narrow wiring is formed on the same plane as the first narrow wiring. This is because a suspension substrate more reduced in strain can be obtained by disposing both of the dummy wide wiring and the dummy narrow wiring at each predetermined positions.

In the above invention, it is preferable that the above dummy wiring is a dummy narrow wiring and the above dummy narrow wiring is formed on the same plane as the above first narrow wiring. This is because a suspension substrate reduced in strain can be easily obtained by disposing the dummy narrow wiring at each predetermined positions.

In the above invention, the above strain-limiting part is preferably a second insulation part formed on the above first narrow wiring and has an adjusted thickness and width. This reason is that a suspension substrate reduced in strain can be easily obtained by adjusting the shape of the (narrow wiring) second insulation part.

In the above invention, a narrow wiring-containing structure having the above strain-limiting part is preferably formed at least in a region extending from a load beam junction jig hole to the head part side. This reason is that this region is easily affected by the strain.

Also, the present invention provides a suspension comprising the above suspension substrate.

According to the present invention, the suspension can be reduced in strain by using the above suspension substrate.

Also, in the present invention, a suspension with a head comprises the above suspension and a magnetic head slider mounted on the suspension.

According to the present invention, the suspension with a head can be reduced in strain by using the above suspension.

The present invention provides a hard disk drive comprising the above suspension with a head.

According to the present invention, a more functionalized hard disc drive can be obtained by using the above suspension with a head.

The present invention produces such an effect that a suspension substrate having reduced strain can be obtained.

DESCRIPTION OF THE PREFERRED EMBODIMENT

A suspension substrate, a suspension, a suspension with a head and hard disc drive of the present invention will be explained in detail.

A. Suspension Substrate

First, the suspension substrate of the present invention will be explained. The suspension substrate of the present invention comprises: a fundamental structure in which a metal substrate, a first insulation layer, and a wiring are laminated in this order; a wide wiring laminate structure provided with a wide wiring first insulation part of the above first insulation layer, a first wide wiring formed on the above wide wiring first insulation part, a second insulation part formed on the above first wide wiring, and a second wide wiring formed on the above second insulation part; and a narrow wiring-containing structure provided with a narrow wiring first insulation part of the above first insulation layer and a first narrow wiring formed on the above narrow wiring first insulation part, wherein the narrow wiring-containing structure is provided with a strain-limiting part to limit strain generated in relation to the above wide wiring laminate structure.

According to the present invention, the narrow wiring-containing structure is provided with the strain-limiting part and therefore, the rigidity balance and weight balance of the whole suspension substrate are improved, enabling the production of a suspension substrate having reduced strain. This makes it possible to stably maintain FH (Fly Height) that defines the clearance between the magnetic head and the disc. Generally, when a wide wiring laminate structure and a narrow wiring monolayer structure are disposed on the right and left sides with respect to the center line of a suspension substrate as shown in the present invention, the suspension substrate is largely affected by thermal shrinkage resulting from the heat history through the process of producing the suspension substrate. Moreover, in such a case, not only the warpage of the whole suspension substrate but also the occurrence of strain in the plane of the suspension substrate tends to occur as mentioned above. On the other hand, the suspension substrate of the present invention is provided with the strain-limiting part, and therefore, the rigidity balance and weight balance of the whole suspension substrate are improved, making possible to reduce the strain in the plane of the suspension substrate. Also, when the strain-limiting part is a dummy wiring as will be mentioned later, a suspension substrate having reduced strain can be easily obtained by carrying out a method of producing a suspension as will be explained later.

Figure 1:
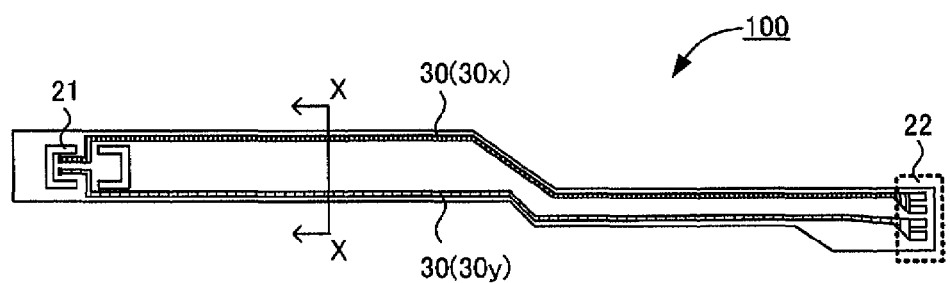
FIG. 1 is a schematic plan view showing an example of a suspension substrate according to the present invention.

FIG. 1 is a schematic plan view showing an example of the suspension substrate of the present invention. A suspension substrate 100 shown in FIG. 1 is provided with: a gimbal part 21 mounted with a magnetic head, a connecting terminal 22 of a junction substrate, and a wiring 30 which connects a magnetic head (not shown) and the connecting terminal 22. The descriptions of, for example, a cover layer that covers the wiring 30 are omitted for the sake of convenience. Moreover, the wiring 30 is provided with a write wiring 30$x$ and a read wiring 30$y$. A wide wiring laminate structure is formed on the write wiring 30$x$ side and a narrow wiring-containing structure is formed on the read wiring 30$y$ side. Next, the terms "wide wiring laminate structure" and "narrow wiring-containing structure" will be explained with reference to FIG. 2.

Figure 2:
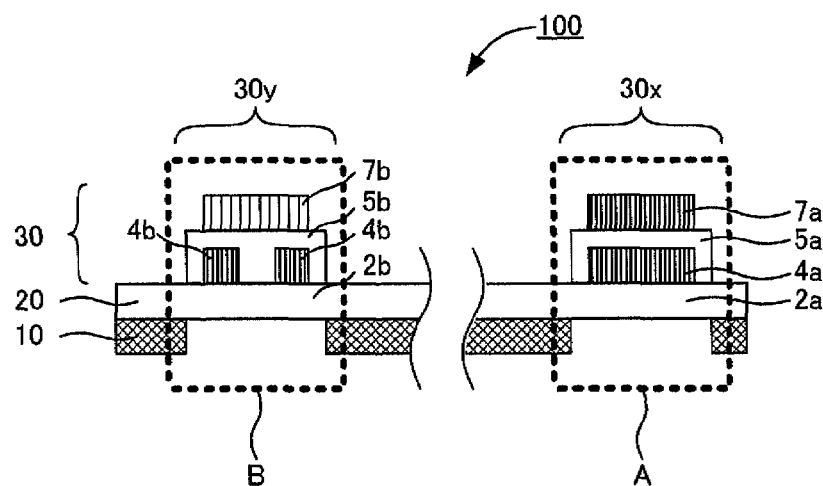
FIG. 2 is a sectional view along the line X-X in FIG. 1.

FIG. 2 is a sectional view along the line X-X of FIG. 1. As shown in FIG. 2, the suspension substrate 100 has a fundamental structure in which a metal substrate 10, a first insulation layer 20, and a wiring 30 are laminated in this order. A wide wiring laminate structure A containing a wide wiring first insulation part 2$a$, a first wide wiring 4$a$ formed on the wide wiring first insulation part 2$a$, a second insulation part 5$a$ formed on the first wide wiring 4$a$, and a second wide wiring 7$a$ formed on the second insulation part 5$a$ is formed on the write wiring 30$x$ side. On the other hand, a narrow wiring-containing structure B containing a narrow wiring first insulation part 2$b$ and plural (two) first narrow wirings 4$b$ formed on the same plane of the narrow wiring first insulation part 2$b$, a second insulation part 5$b$ formed on the first narrow wiring 4$b$, and a dummy wide wiring (strain-limiting part) 7$b$ formed on the second insulation part 5$b$ is formed on the read wiring 30$y$ side.

Here, the dummy wide wiring 7$b$ is one of the dummy wirings according to the present invention. The dummy wiring in the present invention means a wiring having no read/write function. Examples of the wiring having no read/write function may include wirings which do not function as practical wirings. The description "do not function as practical wirings" means that the magnetic head is not connected to the connecting terminal of the junction substrate. In the present invention, a dummy wiring which does not function as a practical wiring is used, and therefore, the present invention has the advantage that the degree of design freedom is more improved than in the case of using a wiring which functions as a practical wiring. Also, in the present invention, a power source wiring which will be explained later is a wiring having no read/write function and may be therefore used as the dummy wiring.

Each structure of the suspension substrate of the present invention will be explained in detail.

1. Wide Wiring Laminate Structure

First, the wide wiring laminate structure in the present invention will be explained. The wide wring laminate structure in the present invention is provided with a wide wiring first insulation part of the first insulation layer, a first wide wiring formed on the wide wiring first insulation part, a second insulation part formed on the first wide wiring, and a second wide wiring formed on the second insulation part. Also, in the present invention, the wiring having a wide wiring laminate structure is preferably a write wiring though it may be either a write wiring or read wiring. This reason is that it is demanded of the write wiring side to have lower impedance. In this case, the wiring having a narrow wiring-containing structure which will be explained later is a read wiring.

(1) Wide Wiring First Insulation Part

The wide wiring first insulation part in the present invention is a region of the first insulation layer constituting the wide wiring laminate structure. Examples of the material of the first insulation layer may include polyimides (PI). The thickness of the first insulation layer is preferably in a range from 5 µm to 15 µm and more preferably in a range from 5 µm to 10 µm.

(2) First Wide Wiring

The first wide wiring in the present invention is formed on the surface of the above wide wiring first insulation part. Examples of the material of the first wide wiring may include copper (Cu). The thickness of the first wide wiring is preferably in a range from 3 µm to 12 µm and more preferably in a range from 4 µm to 9 µm. The width of the first wide wiring is preferably in a range from 50 µm to 300 µm. Particularly, when the impedance is designed to be in a range from 10Ω to 20Ω, the width of the first wide wiring is preferably 100 µm to 250 µm.

(3) Second Insulation Part

The (wide wiring) second insulation part in the present invention is formed on the surface of the above first wide wiring. Any material may be used as the second insulation part without any particular limitation as long as it has predetermined insulation. Examples of the material of the second insulation part may include polyimides (PI). Also, the material of the second insulation part may be either a photosensitive material or a nonphotosensitive material. Also, the above photosensitive material may be either a positive type or a negative type. The thickness of the second insulation part formed on the first wide wiring is preferably in a range from 5 µm to 20 µm and more preferably in a range from 7 µm to 15 µm. Also, the second insulation part may be formed at least between the first wide wiring and the second wide wiring. As shown in FIG. 2, the second insulation part 5$a$ is preferably formed so as to cover the first wide wiring 4$a$.

(4) Second Wide Wiring

The second wide wiring in the present invention is formed on the surface of the above second insulation part. Examples of the material of the second wide wiring may include copper (Cu). The width of the second wide wiring is the same as that of the first wide wiring. In the present invention, the widths of the first wide wiring and second wide wiring may be the same or different. Also, the thickness of the second wide wiring is preferably in a range from 3 µm to 12 µm and more preferably in a range from 4 µm to 9 µm.

(5) Other Members

In the wide wiring laminate structure, the wide wiring first insulation part may be formed on the metal substrate or, as shown in the above FIG. 2, the part of the metal substrate 10 just under the wide wiring first insulator part 2$a$ may be removed. In general, the design of the structure is appropriately made in consideration of factors such as the rigidity of the suspension substrate. Examples of the material of the metal substrate may include SUS. The thickness of the metal substrate is preferably in a range from, for example, 10 µm to 30 µm.

Also, the wide wiring laminate structure preferably has a cover layer that protects wirings. Examples of the material of the cover layer may include polyimides (PI). Also, the material of the cover layer may be either a photosensitive material or a nonphotosensitive material. Also, the above photosensitive material may be either a positive type or a negative type. No particular limitation is imposed on the thickness of the cover layer insofar as it is enough to protect the wirings.

2. Narrow Wiring-Containing Structure

Next, the narrow wiring-containing structure in the present invention will be explained. The narrow wiring-containing structure in the present invention is provided with at least a narrow wiring first insulation part of the first insulation layer and a first narrow wiring formed on the narrow wiring first insulation part. Moreover, in the narrow wiring-containing structure, a strain limiting part that limits the strain generated in relation to the above wide wiring laminate structure is formed.

(1) Narrow Wiring First Insulation Part

The narrow wiring first insulation part in the present invention is a region of the first insulation layer constituting the narrow wiring-containing structure. The material and thickness of the first insulation layer are the same as those described in the above "1. Wide wiring laminate structure, (1) Wide wiring first insulation part". Also, the narrow wiring first insulation part and the wide wiring first insulation part are generally constituted of the same material and have the same thickness.

(2) First Narrow Wiring

The first narrow wiring in the present invention is formed on the surface of the above narrow wiring first insulation part. Generally, plural (for example, two to four) first narrow wirings are formed on the same plane of the narrow wiring first insulation part. The width of the first narrow wiring is, for example, in a range from 15 µm to 80 µm and more preferably in a range from 20 µm to 40 µm. The material and thickness of the first narrow wiring are the same as those described in the above "1. Wide wiring laminate structure, (2) First wide wiring". Also, in the present invention, the first narrow wiring and the first wide wiring are constituted of the same material. The thicknesses of the both are preferably the same.

(3) Strain-Limiting Part

The strain-limiting part in the present invention serves to limit the strain generated in relation to the aforementioned wide wiring laminate structure. Any material may be used for the strain-limiting part of the present invention insofar as it can decrease the strain of the suspension substrate. Specific examples of the strain-limiting part will be explained separately in the case (i) where the strain-limiting part is a dummy wiring and in the case (ii) where the strain-limiting part is a second insulation part of which the thickness and width are adjusted.

(i) In the Case where the Strain-Limiting Part is a Dummy Wiring

In this case, the strain-limiting part may be classified into three embodiments. In light of this, the explanations of the strain-limiting part are divided into first to third embodiments.

(First Embodiment of the Strain-Limiting Part)

Figure 3A:
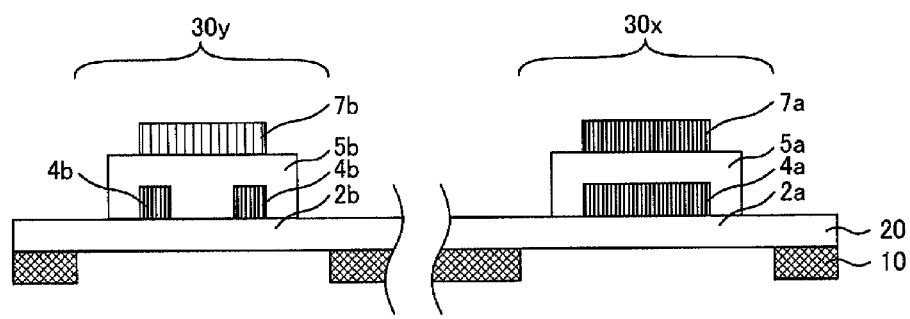
FIGS. 3A to 3C are each a schematic sectional view for explaining a strain-limiting part in the present invention.

In the first embodiment of the strain-limiting part, the dummy wiring is a dummy wide wiring and the dummy wide wiring is formed on the first narrow wiring through the (narrow wiring) second insulation part. Specifically, in this embodiment, as shown in FIG. 3A, a narrow wiring-containing structure provided with a narrow wiring first insulation part $2b$, a first narrow wiring $4b$ formed on the narrow wiring first insulation part $2b$, a second insulation part $5b$ formed on the first narrow wiring $4b$, and a dummy wide wiring $7b$ formed on the second insulation part $5b$ is formed on the read wiring $30y$ side.

According to the first embodiment, the dummy wide wiring is disposed at a predetermined position, which ensures that the rigidity balance and weight balance of the whole suspension substrate are improved, enabling the production of a suspension substrate having reduced strain.

Factors such as the material and thickness of the narrow wiring second insulation part are the same as those described in the above "1. Wide wiring laminate structure, (3) Second insulation part". Also, in the present invention, the narrow wiring second insulation part and the wide wiring second insulation part are preferably constituted of the same material. The thicknesses of the both are likewise preferably the same in the present invention. Also, the width of the narrow wiring second insulation part is preferably designed properly in consideration of the rigidity balance and weight balance of the whole suspension substrate. For example, in a suspension substrate as shown in FIG. 3A, the width of the narrow wiring second insulation part $5b$ is preferably the same as that of the wide wiring second insulation part $5a$.

The material and thickness of the dummy wide wiring are the same as those described in the above "1. Wide wiring laminate structure, (4) Second wide wiring". Also, the dummy wiring can be easily formed by designing the wiring pattern to have the disconnected part. In the present invention, the dummy wide wiring and the second wide wiring are constituted of the same material. The thicknesses of the both are likewise preferably the same. Also, the width of the dummy wide wiring is preferably designed properly in consideration of the rigidity balance and weight balance of the whole suspension substrate. For example, in a suspension substrate as shown by the sectional view in FIG. 3A, the width of the dummy wide wiring $7b$ is preferably the same as that of the second wide wiring $7a$.

(Second Embodiment of the Strain-Limiting Part)

Figure 3B:
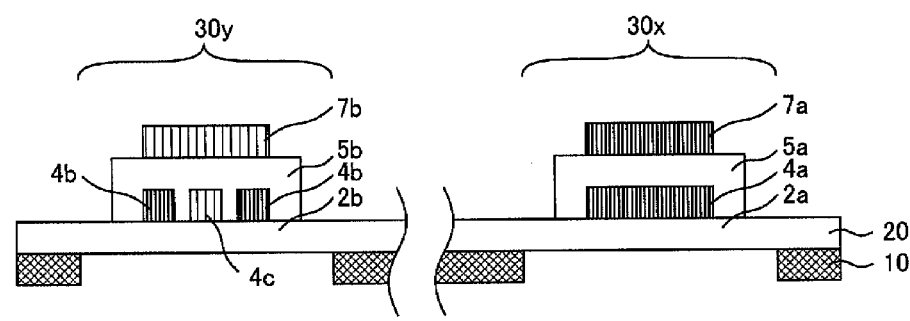

In the second embodiment of the strain-limiting part, the dummy wiring is a dummy wide wiring and a dummy narrow wiring, and the dummy wide wiring is formed on the first narrow wiring through the (narrow wiring) second insulation part and the dummy narrow wiring is formed on the same plane as the first narrow wiring. Specifically, in this embodiment, as shown in FIG. 3B, a narrow wiring-containing structure provided with a narrow wiring first insulation part $2b$, a first narrow wiring $4b$ and a dummy narrow wiring $4c$ formed on the narrow wiring first insulation part $2b$, a second insulation part $5b$ formed on the first narrow wiring $4b$ and on the dummy narrow wiring $4c$ and a dummy wide wiring $7b$ formed on the second insulation part $5b$ is formed on the read wiring $30y$ side.

According to the second embodiment, both the dummy wide wiring and the dummy narrow wiring are disposed at each predetermined position, which ensures that the rigidity balance and weight balance of the whole suspension substrate are more improved, enabling the production of a suspension substrate having reduced strain.

The material, thickness and width of the dummy narrow wiring are the same as those of the first narrow wiring described in the above "2. Narrow wiring-containing structure, (2) First narrow wiring". Also, in the present invention, the dummy narrow wiring and the first narrow wiring are preferably constituted of the same material. The thicknesses of the both are likewise preferably the same. Also, the width of the dummy narrow wiring is preferably designed properly in consideration of the rigidity balance and weight balance of the whole suspension substrate. The dummy narrow wiring has the advantage that the design freedom of dimension (width in particular) is large. Also, the number of dummy narrow wirings is preferably, for example, one or two.

The structures of the narrow wiring second insulation part and dummy wide wiring in the second embodiment are the same as those in the foregoing first embodiment and therefore, the explanations of these parts are omitted here.

(Third Embodiment of the Strain-Limiting Part)

Figure 3C:
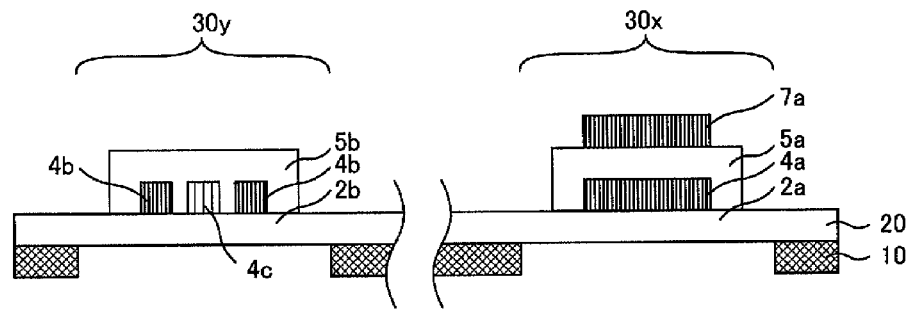

In the third embodiment of the strain-limiting part, the dummy wiring is a dummy narrow wiring and the dummy narrow wiring is formed on the same plane as the first narrow wiring. Specifically, in this embodiment, as shown in FIG. 3C, a narrow wiring-containing structure provided with a narrow wiring first insulation part 2b, and a first narrow wiring 4b and dummy narrow wiring 4c formed on the narrow wiring first insulation part 2b is formed on the read wiring 30y side.

According to the third embodiment, the dummy narrow wiring is disposed at a predetermined position, which ensures that the rigidity balance and weight balance of the whole suspension substrate are improved, enabling the production of a suspension substrate having reduced strain. Particularly, in the third embodiment, as shown in FIG. 3C, a narrow wiring second insulation part 5b is preferably formed on the first narrow wiring 4b and dummy narrow wiring 4c. This reason is that a suspension substrate having more reduced strain can be obtained. The structure of the dummy narrow wiring in the third embodiment is the same as that in the foregoing second embodiment and therefore, the explanations of dummy narrow wiring is omitted here.

Figure 4A:
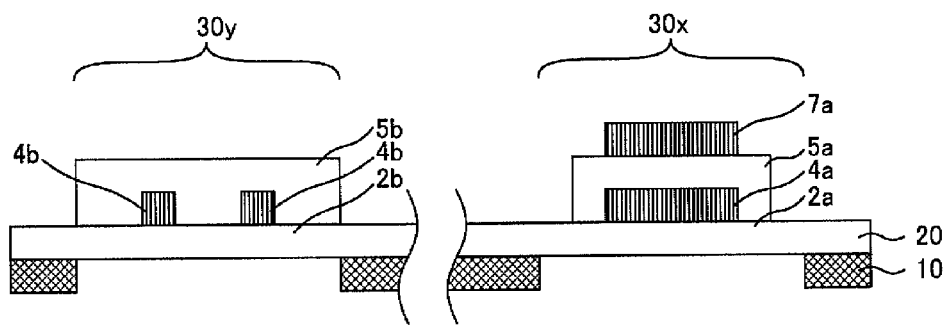
FIGS. 4A and 4B are each a schematic sectional view for explaining a strain-limiting part in the present invention.
Figure 4B:
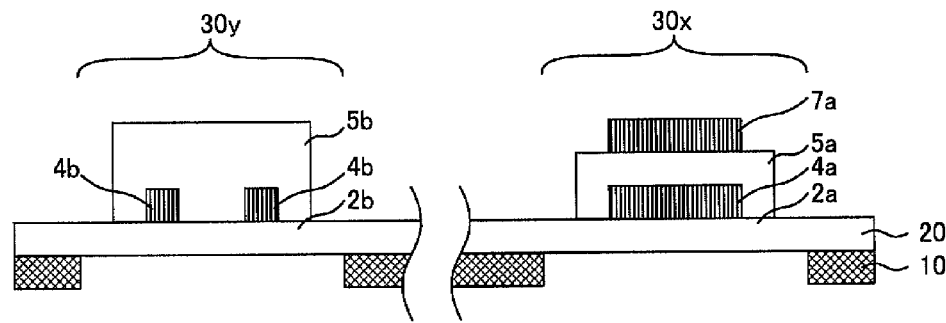

(ii) In the Case where the Strain-Limiting Part is a Second Insulation Part Having Adjusted the Thickness or Width In this case, the adjustment of the shape of the (narrow wiring) second insulation part which is the strain-limiting part improves the rigidity balance and weight balance of the whole suspension substrate, enabling the production of a suspension substrate having reduced strain. Examples of the method of regulating the shape of the second insulation part may include a method in which the width of the narrow wiring second insulation part 5b is adjusted as shown in FIG. 4A and a method in which the height of the narrow wiring second insulation part 5b is adjusted as shown in FIG. 4B. Usually, the narrow wiring second insulation part is formed so as to cover the first narrow wiring.

Also, in the present invention, the strain may be reduced by using both of the dummy wiring and the second insulation part of which the thickness or width is adjusted.

(4) Other Members

In the narrow wiring-containing structure, the narrow wiring first insulation part may be formed on a metal substrate or, as shown in the above FIG. 2, the part of the metal substrate 10 just under and corresponding to the narrow wiring first insulation part 2b may be removed. In general, the design of the structure is appropriately made in consideration of factors such as the rigidity of the suspension substrate. The material, thickness and the like of the metal substrate are the same as those described in the above paragraph "1. Wide wiring laminate structure". Also, the narrow wiring-containing structure is preferably provided with a cover layer that protects wirings. The material and the like of the cover layer are the same as those in the foregoing paragraph "1. Wide wiring laminate structure", and therefore, the explanations of these structures are omitted.

3. Suspension Substrate

The suspension substrate of the present invention comprises: the fundamental structure in which the metal substrate, the first insulation layer, and the wirings are laminated in this order, the wide wiring laminate structure, and the narrow wiring-containing structure as mentioned above.

Figure 5:
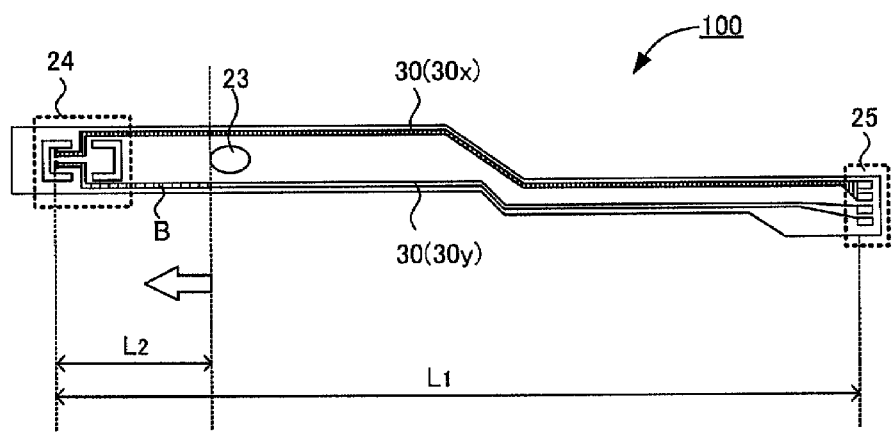
FIG. 5 is a schematic plan view showing an example of a suspension substrate obtained by the present invention.

In particular, it is preferable that the narrow wiring-containing structure having a strain-limiting part formed at least in a region extending from a load beam junction jig hole to the head part side is formed in the present invention. This reason is that this region is easily affected by the strain. Specifically, it is preferable to form a narrow wiring-containing structure B having a strain-limiting part in a region extending from a load beam junction jig hole 23 to the head part 24 side as shown in FIG. 5. Also, as shown in FIG. 5, the distance from the terminal of the wiring of a head part 24 to the terminal of the wiring of a tale part 25 is $L_1$ and the distance where the narrow wiring-containing structure B having a strain-limiting part is formed is $L_2$. In this case, $L_2/L_1$ is preferably ¼ or more, more preferably ½ or more, and even more preferably ¾ or more. Also, $L_2/L_1$ may be 1. Namely, the narrow wiring-containing structure B having a strain-limiting part may be formed in all of the read wirings 30y. In this case, a suspension substrate having more reduced strain may be formed.

4. Method of Producing a Suspension Substrate

Next, a method of producing a suspension substrate according to the present invention will be explained. There is no particular limitation to the method of producing a suspension substrate according to the present invention insofar as it is a method which can produce the above suspension substrate. An example of the method of producing a suspension substrate according to the present invention will be explained with reference to FIGS. 6A to 6G and 7A to 7F. FIGS. 6A to 6G and 7A to 7F conceptually show a part of the section of the suspension substrate of the present invention and there is the case where the structure in these figures is different in dimension from an actual structure.

Figure 6A:
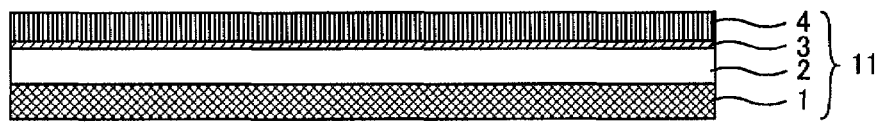
FIGS. 6A to 6G are a schematic sectional view showing an example of a method of producing a suspension substrate according to the present invention.
Figure 6B:
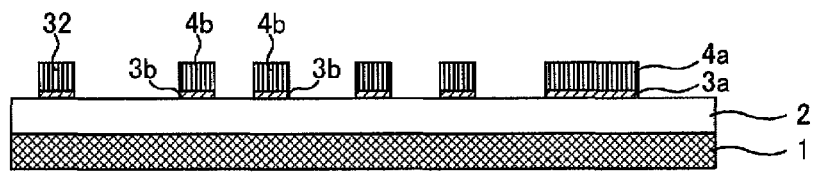
Figure 6C:
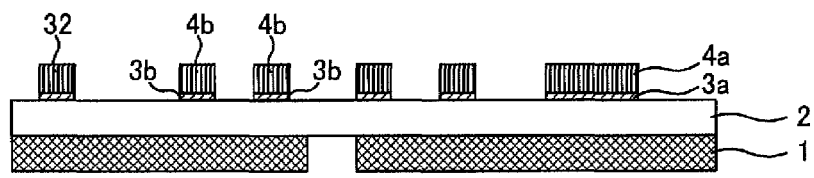
Figure 6D:
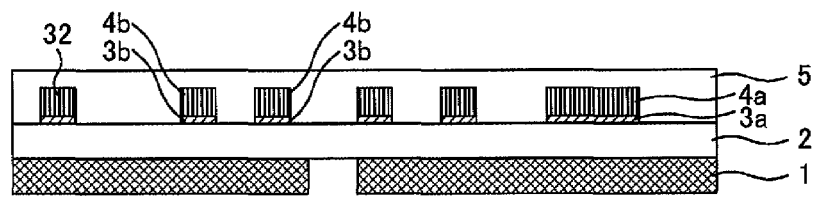

First, a laminate substrate 11 in which a metal substrate 1 made of SUS, a first insulation layer 2 made of a polyimide, and a first seed layer 3 and a first conductive layer 4 made of Cu are laminated in this order is prepared (FIG. 6A). A commercially available three-layer material, for example, may be used as the laminate substrate 11. Next, the first conductive layer 4 and the first seed layer 3 are wet-etched (wet etching using, for example, an aqueous ferric chloride solution or aqueous copper chloride solution) through a predetermined resist pattern to form a first wide wiring 4a and a first seed part 3a in a region where the wide wiring laminate structure is to be formed and to form a first narrow wiring 4b and a first seed part 3b in a region where the narrow wiring-containing structure is to be formed (FIG. 6B). A power source wiring 32 can be formed simultaneously. Also, at the same time, the metal substrate 1 may be wet-etched to make the processing of the outer form of the metal substrate and to form a jig hole (FIG. 6C).

Figure 6E:
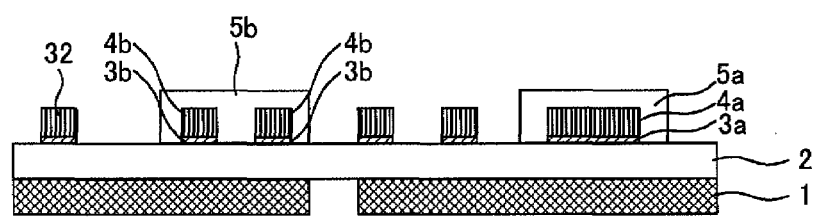
Figure 6F:
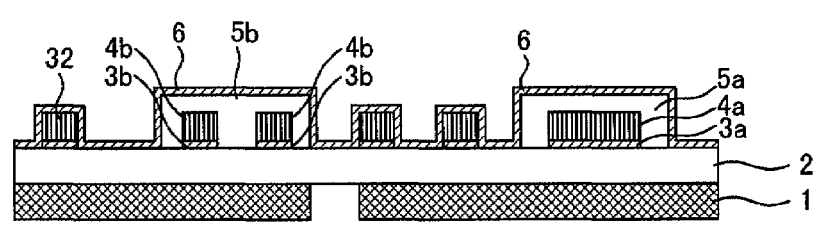
Figure 6G:
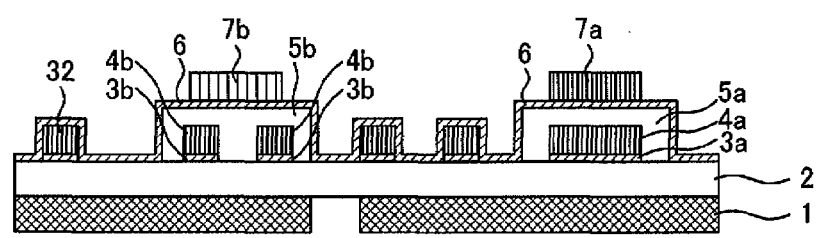

Next, a second insulation layer 5 is formed in such a manner as to cover the first wide wiring 4a and first narrow wiring 4b by a die coater or the like (FIG. 6D), and the second insulation layer 5 is wet-etched (for example, wet etching using an alkaline solution) to form a wide wiring second insulation part 5a on the surface of the first wide wiring 4a and to form a narrow wiring second insulation part 5b on the surface of the first narrow wiring 4b (FIG. 6E). Next, a second seed layer 6 made of Cu is formed by the sputtering method or the like on the surface of the obtained substrate (FIG. 6F). Next, a second wide wiring 7a is formed on the surface of the second seed layer 6 on which the wide wiring-containing laminate structure is to be formed and a dummy wide wiring 7b is formed on the surface of the second seed layer 6 on which the narrow wiring-containing laminate structure is to be formed by the electrolytic plating method or the like (FIG. 6G). At this time, it is preferable to form the second wide wiring 7a and the dummy wide wiring 7b by panel plating and etching. This reason is that a suspension substrate reduced in the dispersion of thickness can be obtained.

Figure 7A:
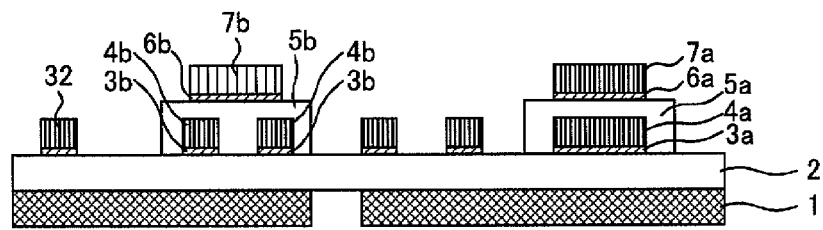
FIGS. 7A to 7F are a schematic sectional view showing an example of a method of producing a suspension substrate according to the present invention.
Figure 7B:
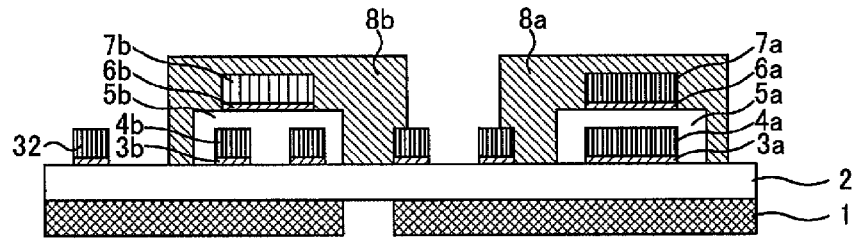
Figure 7C:
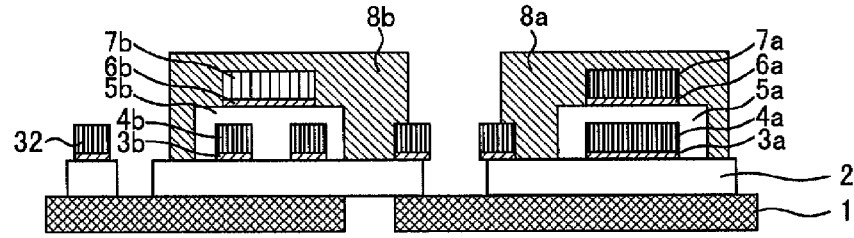
Figure 7D:
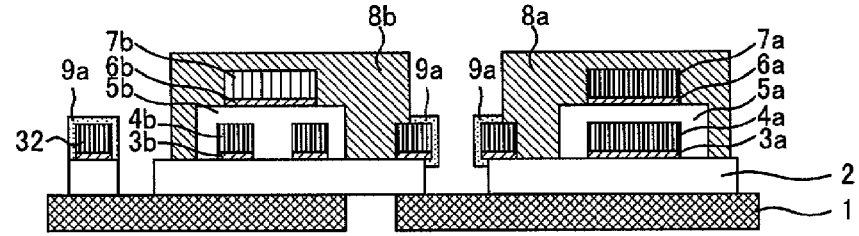
Figure 7E:
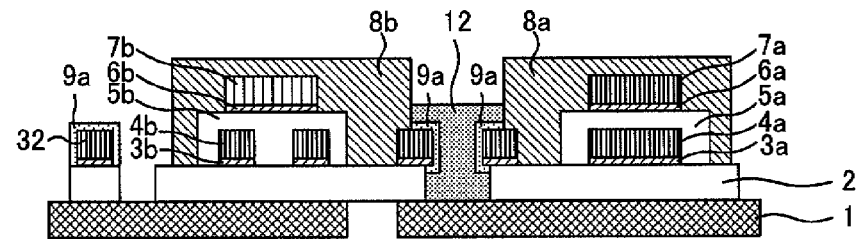
Figure 7F:
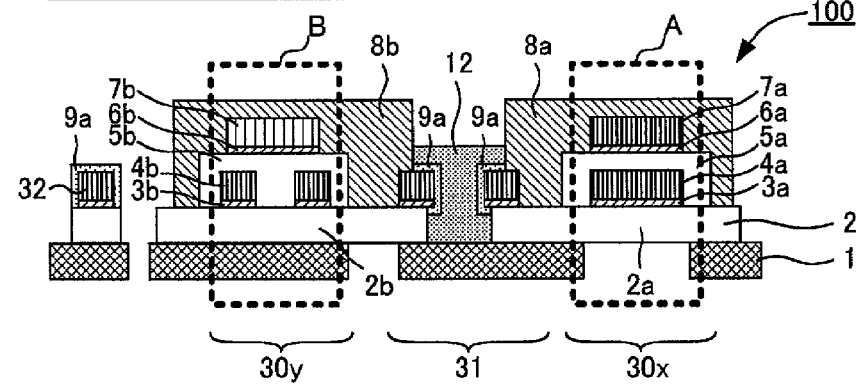

In succession, the second seed layer 6 corresponding to the part where the second wide wiring 7a and dummy wide wiring 7b are not formed is removed by, for example, flash etching to form second seed parts 6a and 6b (FIG. 7A). Then, cover layers 8a and 8b are formed so as to cover a desired wiring part (FIG. 7B). Then, wet etching using an alkali solution or the like is carried out to etch the first insulation layer 2 (FIG. 7C). Thereafter, a wiring plating part 9a made of Ni/Au plating is formed on the exposed wiring part (FIG. 7D) to form a ground terminal 12 by Ni plating (FIG. 7E). Finally, the metal substrate 1 is etched to obtain a suspension substrate 100 having the wide wiring laminate structure A and the narrow wiring-containing structure B (FIG. 7F). The obtained suspension substrate 100 contains a write wiring 30x of the wide wiring laminate structure A, a read wiring 30y of the narrow wiring-containing structure B, a ground terminal part 31 and a power source wiring 32.

B. Suspension

Next, the suspension of the present invention will be explained. The suspension of the present invention is characterized by the feature that it contains the above suspension substrate.

Figure 8:
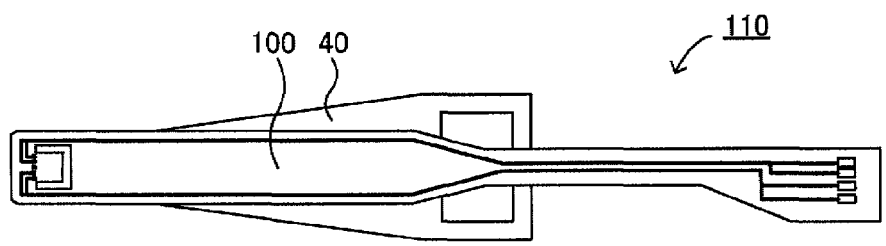
FIG. 8 is a schematic plan view showing an example of a suspension according to the present invention.

FIG. 8 is a schematic plan view showing an example of the suspension of the present invention. A suspension 110 shown in FIG. 8 is provided with the above suspension substrate 100 and a load beam 40 mounted on the surface of the suspension substrate 100 on the side opposite to the surface mounted with a magnetic head slider.

According to the present invention, the aforementioned suspension substrate is used, making it possible to obtain a suspension having reduced strain.

The suspension of the present invention is provided with at least the suspension substrate and usually further contains a load beam. The suspension substrate has the same structure as the above "A. Suspension substrate" and therefore, the description thereof is omitted. Also, as the load beam, the same load beam that is used in general suspensions may be used.

C. Suspension with a Head

Then, the suspension with a head according to the present invention will be explained. The suspension with a head is provided with the aforementioned suspension and a magnetic head slider mounted on the suspension.

Figure 9:
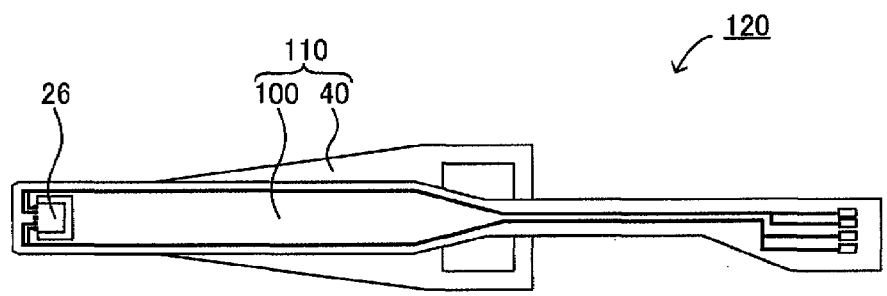
FIG. 9 is a schematic plan view showing an example of a suspension with a head according to the present invention.

FIG. 9 is a schematic plan view showing an example of the suspension with a head according to the present invention. A suspension 120 with a head shown in FIG. 9 is provided with the aforementioned suspension 110 and a magnetic head slider 26 mounted on the suspension 100.

According to the present invention, the aforementioned suspension is used and therefore, a suspension with a head which is reduced in strain can be produced.

The suspension with a head according to the present invention is provided with at least a suspension and a magnetic head slider. The suspension is the same structure as the above "B. Suspension" and the description thereof is omitted. Also, as the magnetic head slider, the same magnetic head slider that is used in usual suspensions with a head may be used.

Also, the suspension and the magnetic head slider can be bound using, for example, an adhesive. The adhesive used in the present invention may be either a conductive adhesive or a nonconductive adhesive. Moreover, the adhesive used in the present invention may be a thermosetting adhesive.

D. Hard Disc Drive

Then, the hard disc drive of the present invention will be explained. The hard disc drive of the present invention is characterized by the feature that it is provided with the above suspension with a head.

Figure 10:
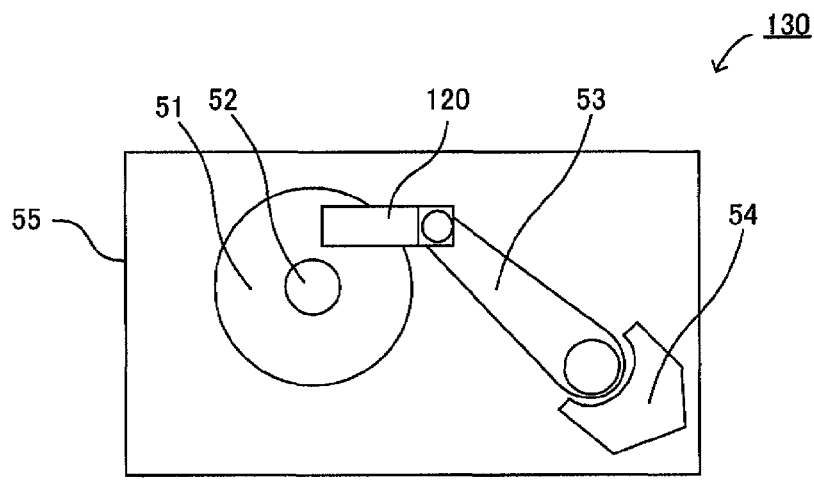
FIG. 10 is a schematic plan view showing an example of a hard disc drive according to the present invention.
Figure 11A:
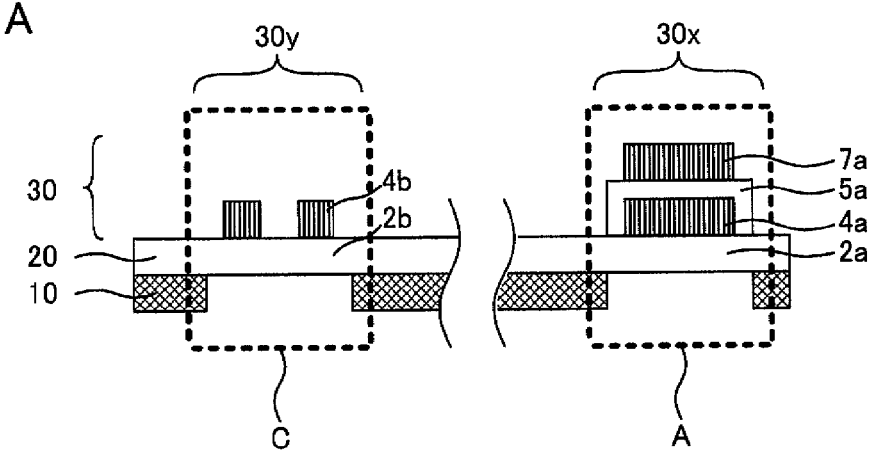
FIGS. 11A and 11B are each an explanatory view for explaining a suspension substrate comprising a wide wiring laminate structure and a narrow wiring monolayer structure.
Figure 11B:
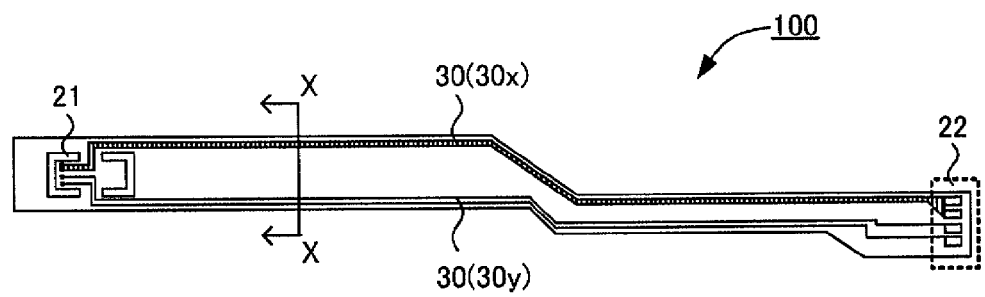

FIG. 10 is a schematic plan view showing an example of the hard disc drive of the present invention. A hard disc drive 130 shown in FIG. 10 is provided with the above suspension 120 with a head, a disc 51 in which data is written and from which data is read by the suspension 120 with a head, a spindle motor 52 that rotates the disc 51, an arm 53 connected to the suspension 120 with a head, an arm 53 and a voice coil motor 54 that moves the magnetic head slider of the suspension 120 with a head, and a case 55 that seals the above members.

According to the present invention, by using the aforementioned suspension with a head, it is made possible to produce a hard disk drive having a higher function.

The hard disc drive of the present invention is provided with at least a suspension with a head and is usually provided further with a disc, a spindle motor, an arm, and a voice coil motor. The suspension with a head is the same structure as the above "C. Suspension with a head" and the description thereof is omitted. Also, as other members, the same members that are used in usual hard disc drives may be used.

The present invention is not limited to the aforementioned embodiments. These embodiments are examples and whatever has substantially the same structure and produces the same action effect as the technical spirit described in the claim of the present invention is embraced by the technical scope of the present invention.

EXAMPLES

The present invention will be explained in more detail by way of examples.

Example

In this example, a suspension substrate provided with a wide wiring laminate structure and a narrow wiring-containing structure as shown in FIG. 7F was manufactured. First, a laminate substrate comprising a metal substrate/first insulation layer/seed layer/first conductive layer was prepared. Here, a laminate substrate comprising stainless as the metal substrate, a polyimide as the first insulation layer, and Cu as the seed layer and first conductive layer was prepared. Next, a metal etching resist was applied to the laminate substrate. Specifically, a metal etching resist layer was formed on each side of the laminate substrate and a resist pattern was formed by the photolithographic method. Here, a resist pattern corresponding to the wiring part is formed on the surface of the first conductive layer and a resist pattern corresponding to the jig hole and flying read part was formed on the surface of the metal substrate. Next, using an aqueous ferric chloride solution as the etching solution, the metal substrate and first conductive layer were etched through the resist pattern to separate the resist pattern. By this treatment, the first wide wiring and first narrow wiring were thereby formed from the first conductive layer and also to form a jig hole and the like on the surface of the metal substrate.

Next, a liquid polyimide was used to form a second insulation part. Specifically, the laminate substrate was coated with a nonphotosensitive polyimide type liquid cover material by using a die coater, followed by drying, and a resist was applied. Then, the resist was exposed to light and then, the liquid cover material was etched at the same time when developing was carried out, followed by curing to form a second insulation part (wide wiring second insulation part and narrow wiring second insulation part). Then, a seed layer was formed by the sputtering method on the surface of the substrate, and then, a pattern plating resist was applied to the seed layer to form a predetermined resist pattern. Then, the exposed seed layer was treated by the electrolytic plating method to form a second wide wiring and a dummy wide wiring. Next, the resist pattern was peeled off to form a cover layer that covered each of the second wide wiring and dummy wide wiring. Specifically, the second wide wiring and the dummy wide wiring were each coated with nonphotosensitive polyimide type liquid cover material by a die coater and dried, followed by applying a resist and then exposed to light. The liquid cover material was etched simultaneously with developing, followed by curing to form each cover layer. Then, an insulation layer etching resist was applied. Specifically, a polyimide etching resist layer was formed on each surface of the obtained laminate substrate to form a resist pattern by the photographic method. Then, an organic alkaline solution was used as the etching solution to etch the insulation layer through the resist pattern for peeling the resist pattern. A wiring part is thereby formed on the metal substrate through the insulation layer in an integrated manner. Also, metal substrate is formed with a jig hole and put in such a state that its outer form has not been changed by processing.

As mentioned above, the laminate substrate was subjected to an etching step excluding the processing of the outer form of the metal substrate and then, predetermined post-processing was carried out. Specifically, first, Au plating was carried out so as to cover the exposed wiring part to form a wiring plating part. Next, in order to carry out the processing of the outer form of the metal substrate, a metal etching resist was applied to the laminated substrate which had been post-processed. Specifically, a metal etching resist layer was formed on each side of the post-processed laminate substrate and a resist pattern corresponding to the outer form was formed only on the surface of the metal substrate by the photographic method. Next, an aqueous ferric chloride solution was used as the etching solution to etch the metal substrate through a resist pattern for peeling of the resist pattern. The suspension substrate of the present invention was thus obtained.

What is claimed is:

1. A suspension substrate comprising:
   a fundamental structure in which a metal substrate, a first insulation layer, and a wiring are laminated in this order;
   a wide wiring laminate structure provided with a wide wiring first insulation part of the first insulation layer, a first wide wiring formed on the wide wiring first insulation part, a second insulation part formed on the first wide wiring, and a second wide wiring formed on the second insulation part; and
   a narrow wiring-containing structure provided with a narrow wiring first insulation part of the first insulation layer and a first narrow wiring formed on the narrow wiring first insulation part,
   wherein the narrow wiring-containing structure is provided with a strain-limiting part formed to limit strain generated in relation to the wide wiring laminate structure.

2. The suspension substrate according to claim 1, wherein the wiring having the wide wiring laminate structure is a write wiring and the wiring having the narrow wiring-containing structure is a read wiring.

3. The suspension substrate according to claim 1, wherein the strain-limiting part is a dummy wiring.

4. The suspension substrate according to claim 3, wherein the dummy wiring is a dummy wide wiring and the dummy wide wiring is formed on the first narrow wiring through a second insulation part.

5. The suspension substrate according to claim 3, wherein the dummy wiring is a dummy wide wiring and a dummy narrow wiring, and the dummy wide wiring is formed on the first narrow wiring through a second insulation part and the dummy narrow wiring is formed on a same plane as the first narrow wiring.

6. The suspension substrate according to claim 3, wherein the dummy wiring is a dummy narrow wiring and the dummy narrow wiring is formed on a same plane as the first narrow wiring.

7. The suspension substrate according to claim 1, wherein the strain-limiting part is a second insulation part formed on the first narrow wiring and having an adjusted thickness or width.

8. The suspension substrate according to claim 1, wherein the narrow wiring-containing structure having the strain-limiting part at least in a region extending from a load beam junction jig hole to a head part side.

9. A suspension comprising the suspension substrate according to claim 1.

10. A suspension with a head comprising the suspension as claimed in claim 9 and a magnetic head slider mounted on the suspension.

11. A hard disk drive comprising the suspension with a head as claimed in claim 10.

* * * * *